United States Patent
Masuoka et al.

(10) Patent No.: US 10,381,451 B2
(45) Date of Patent: *Aug. 13, 2019

(54) SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/788,353

(22) Filed: Oct. 19, 2017

(65) Prior Publication Data

US 2018/0047823 A1 Feb. 15, 2018

Related U.S. Application Data

(63) Continuation of application No. PCT/JP2015/078821, filed on Oct. 9, 2015.

(51) Int. Cl.
*H01L 29/423* (2006.01)
*H01L 29/78* (2006.01)
(Continued)

(52) U.S. Cl.
CPC .... *H01L 29/42356* (2013.01); *H01L 29/4983* (2013.01); *H01L 29/66666* (2013.01);
(Continued)

(58) Field of Classification Search
CPC ......... H01L 29/42356; H01L 29/66666; H01L 29/7788; H01L 29/78; H01L 31/035236;
(Continued)

(56) References Cited

U.S. PATENT DOCUMENTS 7,115,476 B1 10/2006 Izumida
9,419,003 B1 * 8/2016 Colinge .............. H01L 27/1104
(Continued)

FOREIGN PATENT DOCUMENTS

JP H09-298296 A 11/1997
JP 2004-356314 A 12/2004
(Continued)

OTHER PUBLICATIONS

International Search Report in corresponding International Application No. PCT/JP2015/078821, dated Nov. 17, 2015, 5 pages.
(Continued)

*Primary Examiner* — Shahed Ahmed
(74) *Attorney, Agent, or Firm* — Brinks Gilson & Lione

(57) ABSTRACT

A semiconductor device includes a pillar-shaped semiconductor layer formed on a substrate; a first insulator surrounding the pillar-shaped semiconductor layer; a first gate surrounding the first insulator and made of a metal having a first work function; a second gate surrounding the first insulator and made of a metal having a second work function different from the first work function, the second gate being located below the first gate; a third gate surrounding the first insulator and made of a metal having the first work function, the third gate being located below the second gate; and a fourth gate surrounding the first insulator and made of a metal having the second work function different from the first work function, the fourth gate being located below the third gate. The first gate, the second gate, the third gate, and the fourth gate are electrically connected together.

13 Claims, 4 Drawing Sheets

(51) Int. Cl.
*H01L 29/66* (2006.01)
*H01L 29/778* (2006.01)
*H01L 29/49* (2006.01)
*H01L 29/786* (2006.01)

(52) U.S. Cl.
CPC .......... *H01L 29/7788* (2013.01); *H01L 29/78* (2013.01); *H01L 29/7827* (2013.01); *H01L 29/78642* (2013.01)

(58) Field of Classification Search
CPC ............... H01L 29/151; H01L 29/7827; H01L 29/42392; H01L 29/7831; H01L 29/0684; H01L 21/02507; H01L 27/2454; H01L 21/823487; H01L 21/823885; H01L 21/823437–823456; H01L 29/66484
See application file for complete search history.

(56) References Cited

U.S. PATENT DOCUMENTS

| | | | |
|---|---|---|---|
| 2003/0057481 A1* | 3/2003 | Piazza | H01L 27/10823 257/328 |
| 2004/0262681 A1 | 12/2004 | Masuoka et al. | |
| 2008/0173933 A1 | 7/2008 | Fukuzumi et al. | |
| 2008/0251825 A1 | 10/2008 | Lee | |
| 2009/0242869 A1 | 10/2009 | Hovel et al. | |
| 2014/0042558 A1 | 2/2014 | Emeny et al. | |
| 2016/0181453 A1* | 6/2016 | Anantram | H01L 31/035281 257/443 |

FOREIGN PATENT DOCUMENTS

| | | |
|---|---|---|
| JP | 2006-310651 A | 11/2006 |
| JP | 2008-172164 A | 7/2008 |
| JP | 2009-200434 A | 9/2009 |
| JP | 2011-519730 A | 7/2011 |
| JP | 2013-537709 A | 10/2013 |

OTHER PUBLICATIONS

International Preliminary Report on Patentability from the International Bureau for counterpart application PCT/JP2015/078821 dated Apr. 12, 2018, pp. 1-5.

* cited by examiner

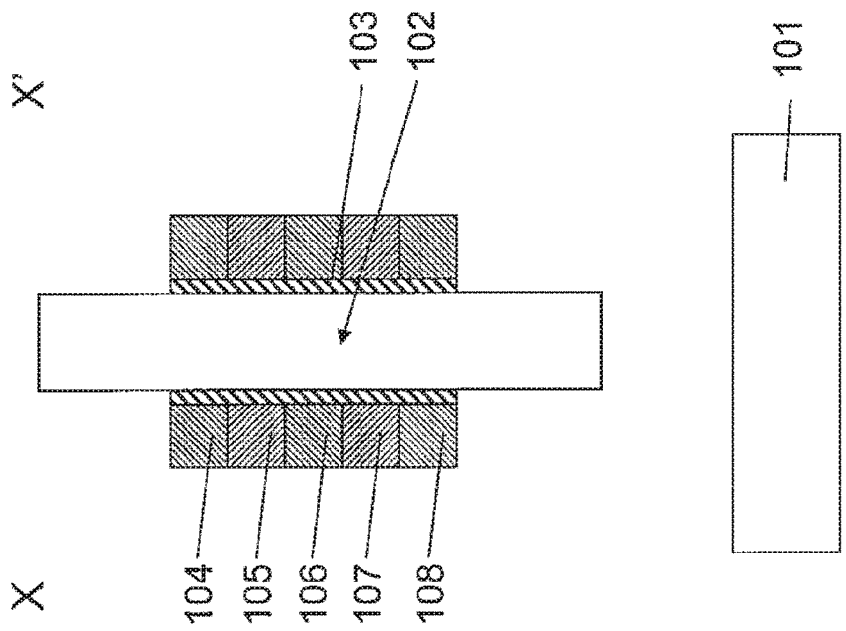
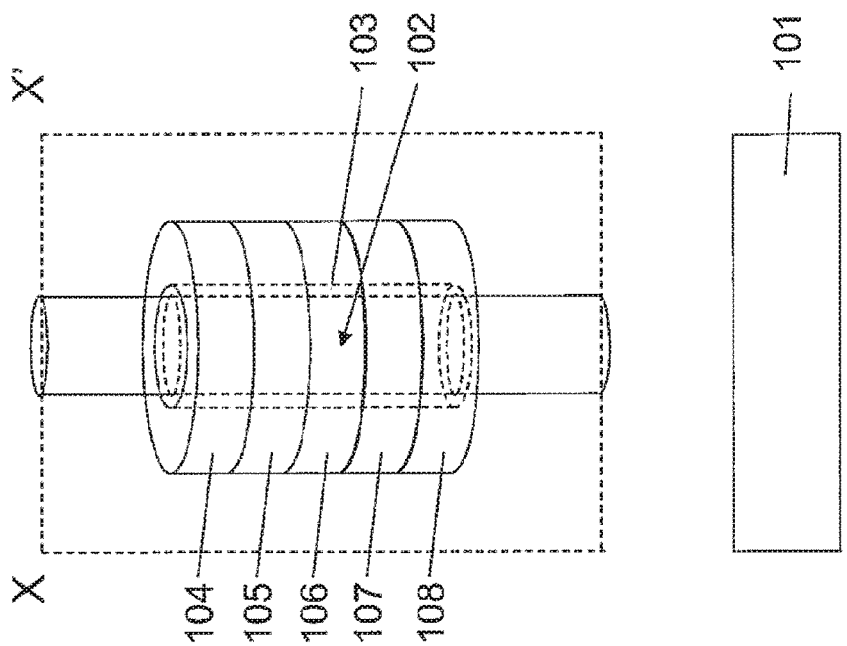

SEMICONDUCTOR DEVICE

RELATED APPLICATIONS

The present application is a continuation application of PCT/JP2015/078821, filed Oct. 9, 2015, the entire contents of which are incorporated herein by reference.

BACKGROUND OF THE INVENTION

1. Field of the Invention

The present invention relates to semiconductor devices.

2. Description of the Related Art

It has been reported that a surrounding gate transistor (SGT) in the related art with a short gate length exhibits an increased drain current due to ballistic conduction (see, for example, Japanese Unexamined Patent Application Publication No. 2009-200434). Ballistic conduction is a phenomenon in which carriers travel from the source to the drain without being scattered if the channel length (gate length) is shorter than the mean free path of the carriers.

However, it has been reported that an SGT in the related art exhibits an increased subthreshold swing if the gate length is 10 nm or less for a silicon pillar diameter of 5 nm (see, for example, Japanese Unexamined Patent Application Publication No. 2004-356314).

It has also been reported that a substrate including various alternating semiconductor layers such as Si/SiGe/Si/SiGe, Si/Ge/Si/Ge, or n-Si/p-Si/n-Si alternating layers is etched to form semiconductor nanowires with embedded quantum wells or a superlattice structure within the semiconductor nanowires (see, for example, Japanese Unexamined Patent Application Publication No. 2011-519730). However, Si/SiGe/Si/SiGe and Si/Ge/Si/Ge alternating layers have interfaces between the substances, which can result in defects. For n-Si/p-Si/n-Si alternating layers, impurity position control is difficult. In addition, the impurities themselves scatter carriers.

SUMMARY OF THE INVENTION

Accordingly, it is an object of the present invention to provide a structure including a pillar-shaped semiconductor layer in which a superlattice or quantum-well structure is formed due to work function differences between metals and a semiconductor.

A semiconductor device according to one aspect of the present invention includes a pillar-shaped semiconductor layer formed on a substrate; a first insulator surrounding the pillar-shaped semiconductor layer; a first gate surrounding the first insulator and made of a metal having a first work function; a second gate surrounding the first insulator and made of a metal having a second work function different from the first work function, the second gate being located below the first gate; a third gate surrounding the first insulator and made of a metal having the first work function, the third gate being located below the second gate; and a fourth gate surrounding the first insulator and made of a metal having the second work function different from the first work function, the fourth gate being located below the third gate. The first gate, the second gate, the third gate, and the fourth gate are electrically connected together.

The semiconductor device may further include a fifth gate surrounding the first insulator and made of a metal having the first work function, the fifth gate being located below the fourth gate. The first gate, the second gate, the third gate, the fourth gate, and the fifth gate may be electrically connected together.

The second work function may be 4.0 eV to 4.2 eV.
The first work function may be 4.2 V or more.
The second work function may be 5.0 eV to 5.2 eV.
The first work function may be 5.0 eV or less.

The semiconductor device may further include a source or drain above the pillar-shaped semiconductor layer and a source or drain below the pillar-shaped semiconductor layer.

The source or drain above the pillar-shaped semiconductor layer and the source or drain below the pillar-shaped semiconductor layer may each be made of a diffusion layer.

The semiconductor device may further include a second insulating film formed between the first gate and the second gate; a third insulating film formed between the second gate and the third gate; and a fourth insulating film formed between the third gate and the fourth gate.

The semiconductor device may further include a fifth insulating film formed between the fourth gate and the fifth gate.

A semiconductor device according to another aspect of the present invention includes a pillar-shaped semiconductor layer formed on a substrate; a first insulator surrounding the pillar-shaped semiconductor layer; a first gate surrounding the first insulator and made of a metal having a first work function; a second gate surrounding the first insulator and made of a metal having a second work function different from the first work function, the second gate being located below the first gate; a third gate surrounding the first insulator and made of a metal having the first work function, the third gate being located below the second gate; an n-type source or drain above the pillar-shaped semiconductor layer; and an n-type source or drain below the pillar-shaped semiconductor layer. The first gate, the second gate, and the third gate are electrically connected together. The first work function is 4.2 eV or more.

The n-type source or drain above the pillar-shaped semiconductor layer and the n-type source or drain below the pillar-shaped semiconductor layer may each be made of a diffusion layer.

The second work function may be 4.0 eV to 4.2 eV.

According to these aspects, a structure including a pillar-shaped semiconductor layer in which a superlattice or quantum-well structure is formed due to work function differences between metals and a semiconductor can be provided.

A semiconductor device according to one aspect of the present invention includes a pillar-shaped semiconductor layer formed on a substrate; a first insulator surrounding the pillar-shaped semiconductor layer; a first gate surrounding the first insulator and made of a metal having a first work function; a second gate surrounding the first insulator and made of a metal having a second work function different from the first work function, the second gate being located below the first gate; and a third gate surrounding the first insulator and made of a metal having the first work function, the third gate being located below the second gate. The first gate, the second gate, and the third gate are electrically connected together.

For example, if the pillar-shaped semiconductor layer is a pillar-shaped silicon layer, the first work function is 5.0 eV to 5.2 eV, which is close to the work function of p-type silicon, i.e., 5.15 eV, and the second work function is 4.0 eV to 4.2 eV, which is close to the work function of n-type silicon, i.e., 4.05 eV, then the portions of the pillar-shaped semiconductor layer surrounded by the first gate and the third gate function as p-type silicon, and the portion of the pillar-shaped semiconductor layer surrounded by the second gate functions as n-type silicon. The portion that functions as p-type silicon, the portion that functions as n-type silicon, and the portion that functions as p-type silicon can form a superlattice or quantum-well structure in the pillar-shaped semiconductor layer due to the work function differences between the metals and the semiconductor.

In this case, since a superlattice or quantum-well structure is formed in the pillar-shaped semiconductor layer due to the work function differences between the metals and the semiconductor, there is no interface between the portions that function as p-type silicon and the portion that functions as n-type silicon, which results in reduced defects. In addition, since no impurity is used, no impurity position control is required, and the scattering of carriers due to impurities can be avoided.

The semiconductor device may further include a fourth gate surrounding the first insulator and made of a metal having the second work function different from the first work function, the fourth gate being located below the third gate. The first gate, the second gate, the third gate, and the fourth gate may be electrically connected together. The semiconductor device may further include a fifth gate surrounding the first insulator and made of a metal having the first work function, the fifth gate being located below the fourth gate. The first gate, the second gate, the third gate, the fourth gate, and the fifth gate may be electrically connected together. Since the gates having the first work function and the gates having the second work function alternately surround the pillar-shaped semiconductor layer, they can form a superlattice in the pillar-shaped semiconductor layer.

The semiconductor device may further include a second insulating film formed between the first gate and the second gate and a third insulating film formed between the second gate and the third gate. The semiconductor device may further include a fourth insulating film formed between the third gate and the fourth gate. The semiconductor device may further include a fifth insulating film formed between the fourth gate and the fifth gate. These insulating films isolate the gates from each other, thus reducing the mixing of a metal having the first work function and a metal having the second work function and the formation of a compound between a metal having the first work function and a metal having the second work function.

A semiconductor device according to another aspect of the present invention includes a pillar-shaped semiconductor layer formed on a substrate; a first insulator surrounding the pillar-shaped semiconductor layer; a first gate surrounding the first insulator and made of a metal having a first work function; a second gate surrounding the first insulator and made of a metal having a second work function different from the first work function, the second gate being located below the first gate; and a third gate surrounding the first insulator and made of a metal having the first work function, the third gate being located below the second gate. The first gate, the second gate, and the third gate are electrically connected together. The semiconductor device further includes a source or drain above the pillar-shaped semiconductor layer and a source or drain below the pillar-shaped semiconductor layer.

For example, if the pillar-shaped semiconductor layer is a pillar-shaped silicon layer, the source or drain above the pillar-shaped semiconductor layer and the source or drain below the pillar-shaped semiconductor layer are n-type, the first gate and the third gate have a height that allows ballistic conduction, the second work function is 4.0 eV to 4.2 eV, which is close to the work function of n-type silicon, i.e., 4.05 eV, and the first work function is higher than or equal to the second work function, then the portions of the pillar-shaped semiconductor layer surrounded by the first gate and the third gate function as a channel of a transistor, and the portion of the pillar-shaped semiconductor layer surrounded by the second gate functions as n-type silicon. The portion that functions as a channel, the portion that functions as n-type silicon, and the portion that functions as a channel form two series-connected transistors having ballistic conduction, thus providing a transistor having ballistic conduction with a long gate length.

The semiconductor device may further include a fourth gate surrounding the first insulator and made of a metal having the second work function different from the first work function, the fourth gate being located below the third gate. The first gate, the second gate, the third gate, and the fourth gate may be electrically connected together. The semiconductor device may further include a fifth gate surrounding the first insulator and made of a metal having the first work function, the fifth gate being located below the fourth gate. The first gate, the second gate, the third gate, the fourth gate, and the fifth gate may be electrically connected together. Since the gates having the first work function and the gates having the second work function alternately surround the pillar-shaped semiconductor layer, they form more than one series-connected transistors having ballistic conduction, thus providing a transistor having ballistic conduction with a long gate length.

BRIEF DESCRIPTION OF THE DRAWINGS

FIG. 1A is a perspective view of a semiconductor device according to an embodiment of the present invention.

FIG. 1B is a sectional view taken along plane X-X' in FIG. 1A.

DETAILED DESCRIPTION OF THE PREFERRED EMBODIMENTS

Figure 2A:
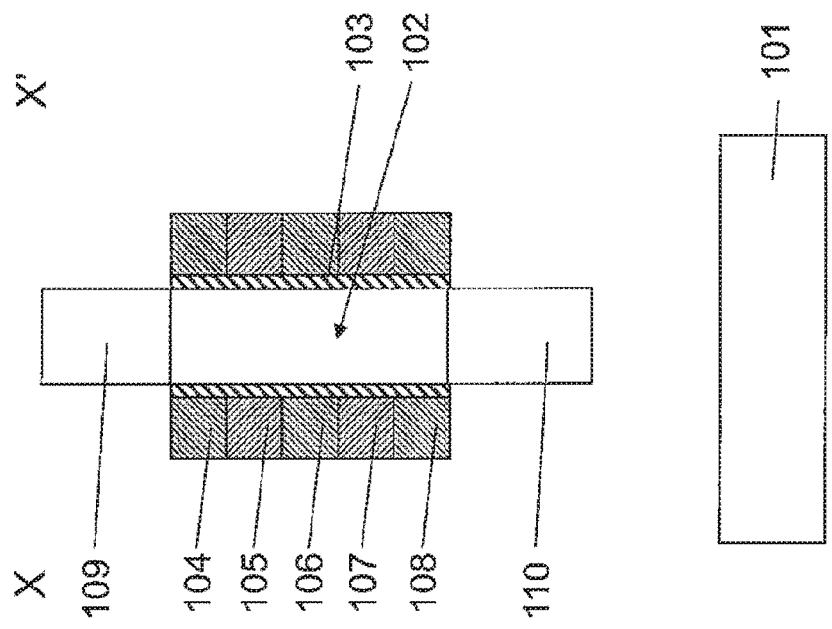
FIG. 2A is a perspective view of a semiconductor device according to an embodiment of the present invention.

A semiconductor device according to an embodiment of the present invention will now be described with reference to FIGS. 1A, 1B, 2A, and 2B. The semiconductor layer used in this embodiment is preferably a silicon layer. The semiconductor layer may also be made of a group IV semiconductor such as germanium (Ge) or carbon (C). The semiconductor layer may also be made of a group III-V compound semiconductor.

The semiconductor device includes a pillar-shaped semiconductor layer 102 formed on a substrate 101; a first insulator 103 surrounding the pillar-shaped semiconductor layer 102; a first gate 104 surrounding the first insulator 103 and made of a metal having a first work function; a second gate 105 surrounding the first insulator 103 and made of a metal having a second work function different from the first work function, the second gate 105 being located below the first gate 104; and a third gate 106 surrounding the first insulator 103 and made of a metal having the first work function, the third gate 106 being located below the second gate 105. The first gate 104, the second gate 105, and the third gate 106 are electrically connected together.

The first insulator 103 functions as a gate insulating film. Preferably, the first insulator 103 is an oxide film, a nitride film, an oxynitride film, or a high-k dielectric film or includes at least one of an oxide film, a nitride film, an oxynitride film, and a high-k dielectric film.

The first gate 104 is in contact with the second gate 105 below the first gate 104, and the second gate 105 is in contact with the third gate 106 below the second gate 105. Thus, the first gate 104, the second gate 105, and the third gate 106 are electrically connected together.

The semiconductor device further includes a fourth gate 107 surrounding the first insulator 103 and made of a metal having the second work function different from the first work function, the fourth gate 107 being located below the third gate 106. The first gate 104, the second gate 105, the third gate 106, and the fourth gate 107 are electrically connected together.

The semiconductor device further includes a fifth gate 108 surrounding the first insulator 103 and made of a metal having the first work function, the fifth gate 108 being located below the fourth gate 107. The first gate 104, the second gate 105, the third gate 106, the fourth gate 107, and the fifth gate 108 are electrically connected together.

The third gate 106 is in contact with the fourth gate 107 below the third gate 106, and the fourth gate 107 is in contact with the fifth gate 108 below the fourth gate 107. Thus, the third gate 106, the fourth gate 107, and the fifth gate 108 are electrically connected together.

Figure 2B:
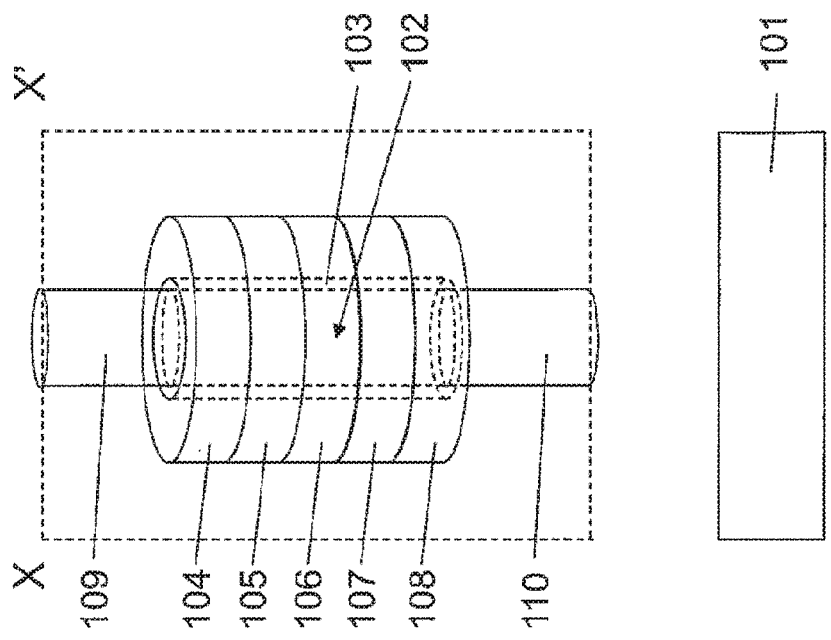
FIG. 2B is a sectional view taken along plane X-X' in FIG. 2A.
Figure 3A:
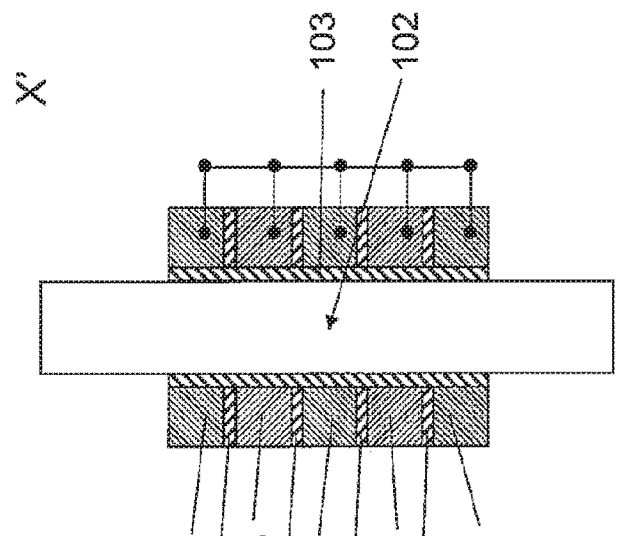
FIG. 3A is a perspective view of a semiconductor device according to an embodiment of the present invention.
Figure 3B:
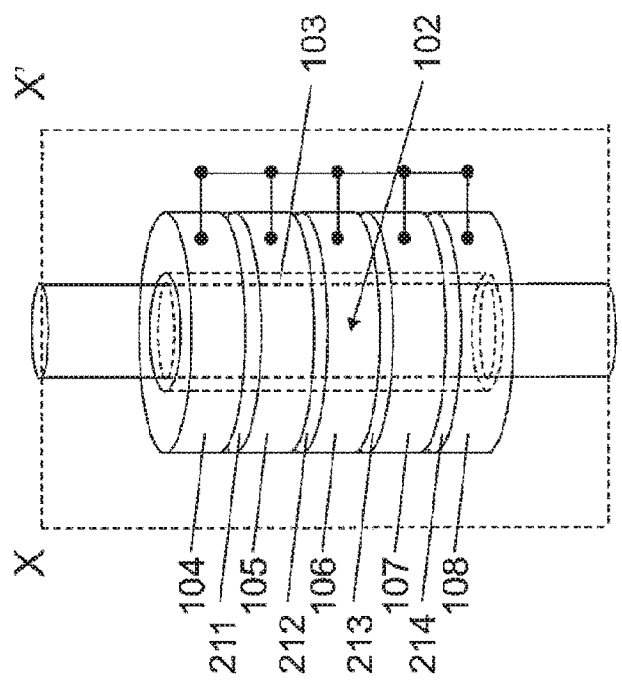
FIG. 3B is a sectional view taken along plane X-X' in FIG. 3A.
Figure 4A:
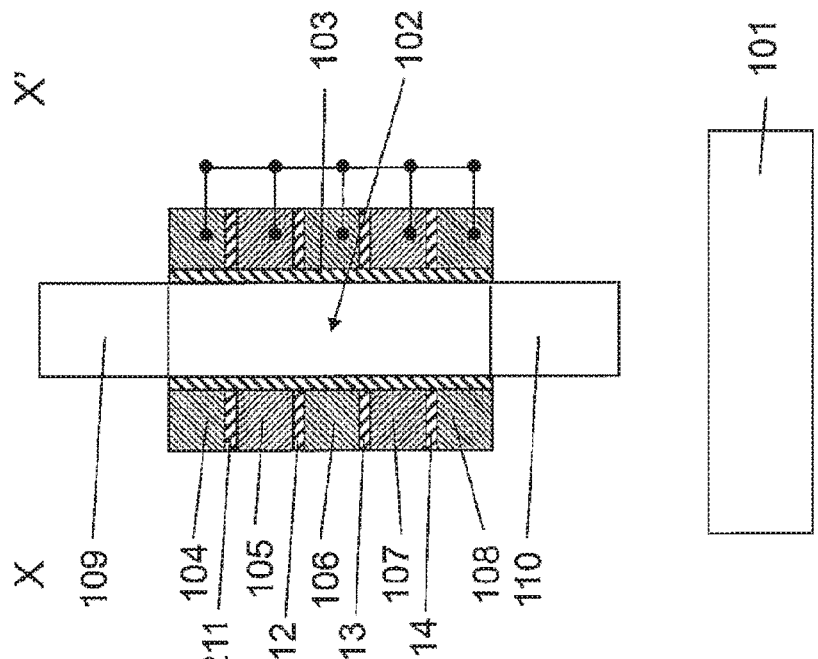
FIG. 4A is a perspective view of a semiconductor device according to an embodiment of the present invention.
Figure 4B:
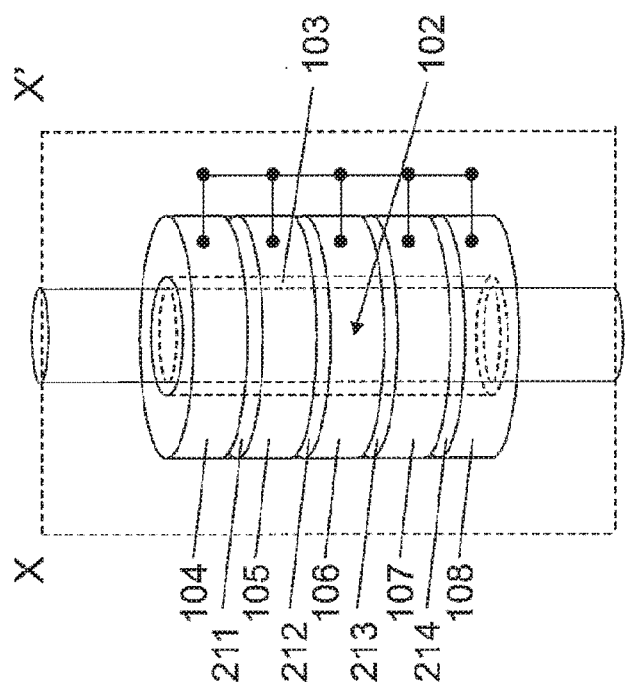
FIG. 4B is a sectional view taken along plane X-X' in FIG. 4A.

FIGS. 2A and 2B illustrate a structure including, in addition to the structure shown in FIGS. 1A and 1B, a source or drain 109 above the pillar-shaped semiconductor layer 102 and a source or drain 110 below the pillar-shaped semiconductor layer 102. The source or drain 109 above the pillar-shaped semiconductor layer 102 and the source or drain 110 below the pillar-shaped semiconductor layer 102 allow the semiconductor device to operate as a transistor. The source or drain 109 and the source or drain 110 may each be made of a diffusion layer.

The second work function is preferably 4.0 eV to 4.2 eV. Since the second work function is close to the work function of n-type silicon, i.e., 4.05 eV, the portions of the pillar-shaped semiconductor layer 102 surrounded by the second gate 105 and the fourth gate 107, which have the second work function, function as n-type silicon if the pillar-shaped semiconductor layer 102 is made of silicon. For example, a compound between tantalum and titanium (TaTi) and tantalum nitride (TaN) are preferred.

The first work function is preferably 4.2 eV or more. If the first work function is 4.2 eV or more, a transistor including a channel formed by the gates having the first work function (first gate 104, third gate 106, and fifth gate 108) can operate as an n-type enhancement-mode transistor. For example, metals having mid-gap work functions, ruthenium (Ru), and titanium nitride (TiN) are preferred.

If the first gate 104 and the third gate 106 have a height that allows ballistic conduction, they form two series-connected transistors having ballistic conduction, thus providing a transistor having ballistic conduction with a long gate length.

If the first gate 104, the third gate 106, and the fifth gate 108 have a height that allows ballistic conduction, they form more than one series-connected transistors having ballistic conduction, thus providing a transistor having ballistic conduction with a long gate length.

The first gate 104, the third gate 106, and the fifth gate 108 preferably have the same height, whereas the second gate 105 and the fourth gate 107 preferably have the same height. If the first gate 104, the third gate 106, and the fifth gate 108 have the same height and the second gate 105 and the fourth gate 107 have the same height, they can form a periodic potential in the pillar-shaped semiconductor layer 102 due to the work function differences between the metals and the semiconductor.

If the first work function is 5.0 eV to 5.2 eV, which is close to the work function of p-type silicon, i.e., 5.15 eV, the portions of the pillar-shaped semiconductor layer 102 surrounded by the first gate 104, the third gate 106, and the fifth gate 108 function as p-type silicon. For example, ruthenium (Ru) and titanium nitride (TiN) are preferred.

In this case, the portions that function as p-type silicon and the portions that function as n-type silicon can form a superlattice or quantum-well structure in the pillar-shaped semiconductor layer 102 due to the work function differences between the metals and the semiconductor.

As described above, since the gates having the first work function and the gates having the second work function alternately surround the pillar-shaped semiconductor layer 102, they can form a superlattice in the pillar-shaped semiconductor layer 102.

In this case, since a superlattice or quantum-well structure is formed in the pillar-shaped semiconductor layer 102 due to the work function differences between the metals and the semiconductor, there is no interface between the portions that function as p-type silicon and the portions that function as n-type silicon, which results in reduced defects. In addition, since no impurity is used, no impurity position control is required, and the scattering of carriers due to impurities can be avoided.

The second work function is also preferably 5.0 eV to 5.2 eV. Since the second work function is close to the work function of p-type silicon, i.e., 5.15 eV, the portions of the pillar-shaped semiconductor layer 102 surrounded by the second gate 105 and the fourth gate 107, which have the second work function, function as p-type silicon if the pillar-shaped semiconductor layer 102 is made of silicon. For example, ruthenium (Ru) and titanium nitride (TiN) are preferred.

The first work function is also preferably 5.0 eV or less. If the first work function is 5.0 or less, a transistor including a channel formed by the gates having the first work function (first gate 104, third gate 106, and fifth gate 108) can operate as a p-type enhancement-mode transistor. For example, metals having mid-gap work functions, a compound between tantalum and titanium (TaTi), and tantalum nitride (TaN) are preferred.

If the first work function is 4.0 eV to 4.2 eV, which is close to the work function of n-type silicon, i.e., 4.05 eV, the portions of the pillar-shaped semiconductor layer 102 surrounded by the first gate 104, the third gate 106, and the fifth gate 108 function as n-type silicon. For example, a compound between tantalum and titanium (TaTi) and tantalum nitride (TaN) are preferred.

As shown in FIGS. 3A, 3B, 4A, and 4B, the semiconductor device may further include a second insulating film 211 formed between the first gate 104 and the second gate 105 and a third insulating film 212 formed between the second gate 105 and the third gate 106.

The semiconductor device may further include a fourth insulating film 213 formed between the third gate 106 and the fourth gate 107.

The semiconductor device may further include a fifth insulating film 214 formed between the fourth gate 107 and the fifth gate 108.

Preferably, each of the second insulating film 211, the third insulating film 212, the fourth insulating film 213, and the fifth insulating film 214 is an oxide film, a nitride film, an oxynitride film, or a high-k dielectric film or includes at least one of an oxide film, a nitride film, an oxynitride film, and a high-k dielectric film.

These insulating films 211, 212, 213, and 214 isolate the gates 104, 105, 106, 107, and 108 from each other, thus reducing the mixing of a metal having the first work function and a metal having the second work function and the formation of a compound between a metal having the first work function and a metal having the second work function.

In this case, the gates 104, 105, 106, 107, and 108 need to be electrically connected together with contacts and wiring.

It should be understood that various embodiments and modifications are possible without departing from the broad spirit and scope of the invention. The foregoing embodiment is intended for purposes of illustration only and is not intended to limit the scope of the invention.

For example, in the foregoing embodiment, p-type (including p+-type) and n-type (including n+-type) may be replaced with their respective opposite conductivity types, and such semiconductor devices are, of course, included in the technical scope of the invention.

What is claimed is:

1. A semiconductor device comprising:
    a pillar-shaped semiconductor layer on a substrate;
    a first insulator surrounding the pillar-shaped semiconductor layer;
    a first gate surrounding the first insulator and comprising a metal having a first work function;
    a second gate surrounding the first insulator and comprising a metal having a second work function different from the first work function, the second gate below the first gate;
    a third gate surrounding the first insulator and comprising a metal having the first work function, the third gate below the second gate; and
    a fourth gate surrounding the first insulator and comprising a metal having the second work function, the fourth gate being located below the third gate,
    wherein the first gate, the second gate, the third gate, and the fourth gate are electrically connected together by one or both of physical contact or by wiring.

2. The semiconductor device according to claim 1, further comprising a fifth gate surrounding the first insulator and comprising a metal having the first work function, the fifth gate below the fourth gate,
    wherein the first gate, the second gate, the third gate, the fourth gate, and the fifth gate are electrically connected together by one or both of physical contact or by wiring.

3. The semiconductor device according to claim 1, wherein the second work function is 4.0 eV to 4.2 eV.

4. The semiconductor device according to claim 3, wherein the first work function is 4.2 eV or more.

5. The semiconductor device according to claim 1, wherein the second work function is 5.0 eV to 5.2 eV.

6. The semiconductor device according to claim 5, wherein the first work function is 5.0 eV or less.

7. The semiconductor device according to claim 1, further comprising:
    a source or drain above the pillar-shaped semiconductor layer; and
    a source or drain below the pillar-shaped semiconductor layer.

8. The semiconductor device according to claim 7, wherein the source or drain above the pillar-shaped semiconductor layer and the source or drain below the pillar-shaped semiconductor layer each comprise a diffusion layer.

9. The semiconductor device according to claim 1, further comprising:
    a second insulating film between the first gate and the second gate;
    a third insulating film between the second gate and the third gate; and
    a fourth insulating film between the third gate and the fourth gate.

10. The semiconductor device according to claim 2, further comprising a fifth insulating film between the fourth gate and the fifth gate.

11. A semiconductor device comprising:
    a pillar-shaped semiconductor layer on a substrate;
    a first insulator surrounding the pillar-shaped semiconductor layer;
    a first gate surrounding the first insulator and comprising a metal having a first work function;
    a second gate surrounding the first insulator and comprising a metal having a second work function different from the first work function, the second gate below the first gate;
    a third gate surrounding the first insulator and comprising a metal having the first work function, the third gate below the second gate;
    an n-type source or drain above the pillar-shaped semiconductor layer; and
    an n-type source or drain below the pillar-shaped semiconductor layer,
    wherein the first gate, the second gate, and the third gate are electrically connected together by one or both of physical contact or by wiring, and
    wherein the first work function is 4.2 eV or more.

12. The semiconductor device according to claim 11, wherein the source or drain above the pillar-shaped semiconductor layer and the source or drain below the pillar-shaped semiconductor layer each comprise a diffusion layer.

13. The semiconductor device according to claim 11, wherein the second work function is 4.0 eV to 4.2 eV.

* * * * *

UNITED STATES PATENT AND TRADEMARK OFFICE
CERTIFICATE OF CORRECTION

PATENT NO. : 10,381,451 B2
APPLICATION NO. : 15/788353
DATED : August 13, 2019
INVENTOR(S) : Fujio Masuoka et al.

Page 1 of 1

It is certified that error appears in the above-identified patent and that said Letters Patent is hereby corrected as shown below:

In the Claims

Column 7, Claim 1, Line 48, delete "being located".

Signed and Sealed this
Twelfth Day of November, 2019

Andrei Iancu
*Director of the United States Patent and Trademark Office*